United States Patent [19]

Lehrfeld

[11] 3,806,767

[45] Apr. 23, 1974

[54] INTERBOARD CONNECTOR

[75] Inventor: Sanford S. Lehrfeld, East Windsor Township, N.J.

[73] Assignee: Tek-Wave, Inc., Somerville, N.J.

[22] Filed: Mar. 15, 1973

[21] Appl. No.: 341,337

[52] U.S. Cl........... 317/101 CC, 333/84 M, 339/19, 339/176 MF

[51] Int. Cl........................................... H05k 1/04

[58] Field of Search..... 333/84 M; 339/19, 176 MF, 339/143; 317/101 PH, 101 CC

[56] References Cited

UNITED STATES PATENTS

| | | | |
|---|---|---|---|
| 3,218,585 | 11/1965 | May | 339/19 |
| 3,506,932 | 4/1970 | Beurrier | 333/84 M |

*Primary Examiner*—David Smith, Jr.

*Attorney, Agent, or Firm*—Ostrolenk, Faber, Gerb & Soffen

[57] ABSTRACT

An interboard connector for microwave and high-speed circuitry applications such as, for example, employed in computer technology. A solid conductive block is provided with at least one notch for receiving a substantially C-shaped conductive member having one or more strips of insulation material along its interior surface. The insulation material provides a tri-plate structure bent to conform to the C-shaped configuration of the C-shaped conductive member which is force-fitted into the notched block. The tri-plate structure extends from a pair of openings and its ends each adapted to receive and be electrically connected with cooperating edges of a pair of printed wiring boards which are typically provided with a ground plane separated from printed wiring by an intermediate insulating substrate. The arrangement permits simple and yet rapid interconnection between circuit boards and provides excellent impedance matching and a low VSWR. Either one or a plurality of pairs of such tri-plate structures may be provided for connecting circuit boards arranged in spaced substantially parallel fashion.

8 Claims, 12 Drawing Figures

INTERBOARD CONNECTOR

The present invention relates to connectors and more particularly to a novel interboard connector employed in high-speed computer type and microwave applications for providing circuit connections between spaced parallel printed wiring boards.

BACKGROUND OF THE INVENTION

In computer and microwave technology it is quite common to design electronic systems employed in such technology which systems are comprised of a plurality of printed wiring boards each containing discrete solid state components interconnected by the wiring arrangement of the printed wiring boards, which wiring arrangement is typically printed upon the board in a variety of patterns to provide interconnections between and among the discrete components of the board.

Due to the complexity of such devices it is quite common and in fact necessary to provide a large number of boards to form a particular circuit or system.

The printed wiring boards containing the discrete components are usually arranged in spaced parallel fashion and are coupled to one another through either interboard feedthroughs such as that described in U.S. Pat. No. 3,596,138 issued July 27, 1971 and assigned to the assignee of the present invention, or through the employment of edge connectors. The number of interconnections between and among such boards requires the use of a large plurality of such connectors which preferably provide good impedance matching between the connected components and a low VSWR.

A BRIEF DESCRIPTION OF THE INVENTION AND OBJECTS

The present invention is characterized by providing a novel interboard connector for use in high-speed switching and microwave applications which is comprised of a notched conductor block and at least one C-shaped conductive member which is press-fitted into the notched conductor block and which is provided with a narrow tape-like conductive member mounted upon a first suitable insulating substrate which is fitted between the conductor block and the C-shaped member so as to follow the contour of the C-shaped member. The opposite surface of the first insulating substrate is completely covered with a conductive surface. A second insulating substrate having a first conductive surface and an insulating surface is placed against the surface of the first insulating substrate having the narrow-tape-like conductor to form a tri-plate structure. The conductive block and C-shaped member, when interfitted in a press-fitted manner provide a pair of slit-like openings in one surface of said block. The ends of the tri-plate structure extends outwardly therefrom and are adapted to receive the ends of printed wiring boards and be electrically connected thereto to provide an electrical connection between the two print wiring boards.

The simplicity of design and assembly provides a rugged interboard connection which further provides excellent impedance matching and low VSWR.

It is therefore one object of the present invention to provide a novel interboard connector for printed wiring boards and the like employed in high-speed switching and microwave applications for interconnecting circuits between and among boards through an edge connecting technique, to provide a simple and reliable interboard connector for interconnecting the circuits and providing excellent impedance matching and a low VSWR.

A BRIEF DESCRIPTION OF THE FIGURES

The above as well as other objects of the present invention will become apparent when reading the accompanying description and drawings in which:

FIGS. 1*a* and 1*b* are perspective views showing the conductive notched block and the conductive C-shaped block respectively which cooperatively form the connector of the present invention;

FIG. 1*c* is a perspective view showing the components of FIGS. 1*a* and 1*b* in the assembled fashion with the connection slits in view;

FIG. 1*d* is a perspective view showing the notched and C-shaped conductor blocks in the assembled form looking in the direction opposite that of FIG. 1*c;*

FIGS. 2*a* and 2*b* are front and side views, respectively, of the conductive C-shaped member of FIG. 1*b;*

Figures 1A, 1B, 1C, 1D, 2A, 2B, 3, 4, 5, 5A:
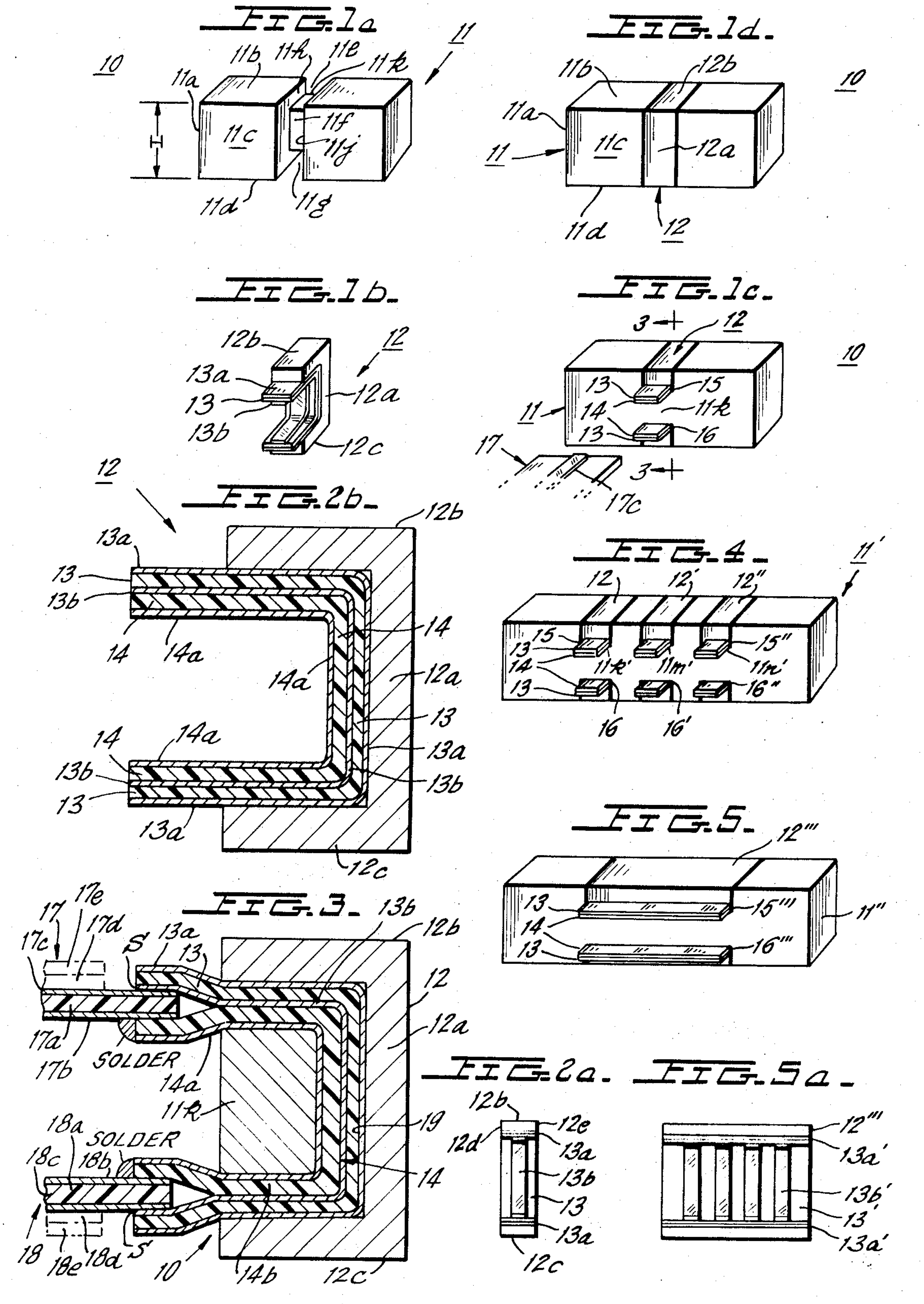
FIG. 3 shows the manner in which printed wiring boards are electrically connected to the interboard connector assembly as shown in FIGS. 1*a*–2*b;*
FIGS. 4, 5 and 6 show perspective views of alternative embodiments for the connector assembly of FIGS. 1*a*–2*b;*
Figure 6A:
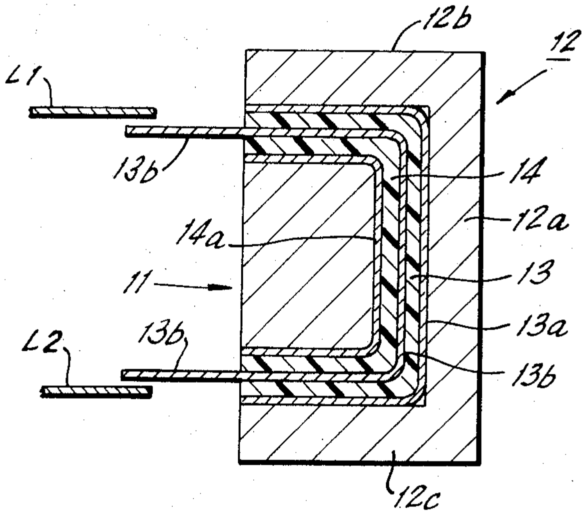
Figure 6:
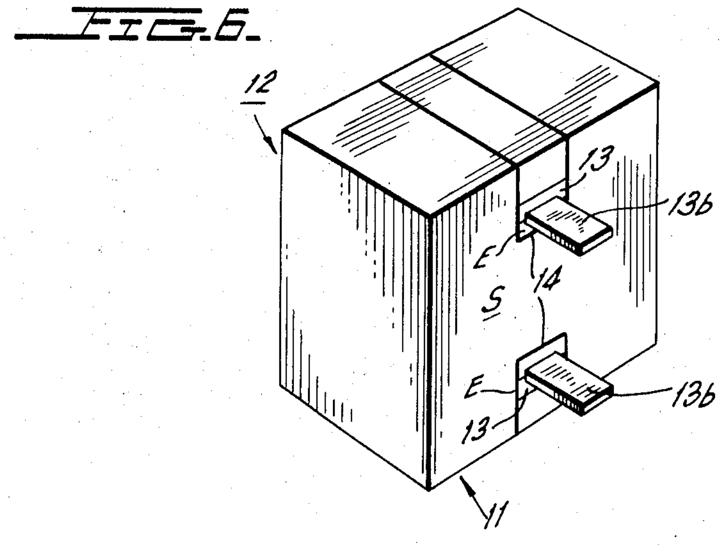

FIG. 5*a* shows a front elevational view of the C-shaped conductive block employed in the embodiment of FIG. 5; and FIG. 6*a* shows a sectional view of the embodiment of FIG. 6.

DETAILED DESCRIPTION OF THE FIGURES

FIGS. 1*a*–2*b* show an interboard connector assembly 10 comprised of a notched conductive block 11 (note especially FIG. 1*a*) and a C-shaped conductive member 12 (note especially FIGS. 1*b*, 2*a* and 2*b*).

The notched conductive block is formed from a single block 11*a* of a conductive material which is notched along its upper, side and bottom surfaces 11*b*, 11*c* and 11*d*, respectively, to form the aligned notches 11*e*, 11*f* and 11*g*, respectively. A conductive C-shaped member 12 is provided with a yoke portion 12*a* having outwardly extending perpendicularly aligned arms 12*b* and 12*c*. A first flat insulating substrate 13 having a conductive surface 13*a* is pressed into the region defined by the interior surfaces of the conductive C-shaped member 12 in the manner shown best in FIGS. 1*b*, 2*a* and 2*b*, wherein the first insulating substrate conductive surface 13*a* engages the interior surfaces of arms 12*b* and 12*c*, as well as the interior surface of the yoke portion 12*a*. A thin tape-like conductive strip or member 13*b* is affixed to the remaining surface of insulating substrate 13 and is electrically insulated from C-shaped conductive block 12 by the insulating substrate 13. A second insulating substrate 14 having a conductive surface 14*a* has its insulating surface 14*b* pressed against conductor 13*b* to form a tri-plate structure.

The two components 11 and 12 are interfitted in the manner shown best in FIGS. 1*c* and 1*d* so that the arms 12*b* and 12*c* interfit within the notches 11*e* and 11*g*, respectively, and so that the yoke portion 12*a* is interfitted into notch 11*f*. The components 11 and 12 are machined in such a manner that the sides 12*d* and 12*e* of C-shaped conductor member 12 physically engage

*the sides* 11*h* and 11*j* of the notches 11*e*, 11*f* and 11*g* so as to form a very tight press-fit therebetween.

The C-shaped conductive member 12 is further machined or otherwise formed so as to cooperate with the notches 11*e* and 11*g* in block 11 to form slits 15 and 16, shown best in FIG. 1*c*, which are adapted to allow extending projections of the tri-plate structure to extend therefrom. A pair of printed wiring boards are electrically connected to the tri-plate structure in the manner shown best in FIG. 3 which is a sectional view of FIG. 1*c* looking in the direction of arrows 3—3. As shown in FIG. 3, portions of printed circuit boards 17 and 18 (the entire length of the boards having been omitted from FIG. 3 for purposes of simplicity) are each comprised of an insulating substrate 17*a*, 18*a* having a conductive ground plane 17*b*, 18*b* over one surface and each having at least one printed wire conductor 17*c*, 18*c* on their opposite surfaces arranged in any suitable pattern and extending to the edges of the respective boards. The edges of the printed wiring boards 17 and 18 are designed to be soldered or connected with a conductive epoxy to the tri-plate structure whereby conductor 13*b* is connected to printed wire conductors 17*c* and 18*c* and conductive surface 14*a* is connected to ground planes 17*b* and 18*b* to provide a good electrical and mechanical connection between the interboard connector assembly 10 and the printed wiring boards.

The conductive coatings 17*c* and 18*c* are printed wire coatings which are arranged to make firm electrical engagement with the thin flat conductive member 13*b* provided upon the insulating substrate 13. The section 11*k* of the notched conductive block 11 makes electrical engagement with the ground planes conductive surface 14*a*. The thin flat conductive strip 13*b* is electrically connected with the printed wire conductors 17*c* and 18*c* to establish a good conductive path between these printed wiring conductors. The insulating substrate is pressed up against conductive C-shaped member 12 so as to provide a gap between the central portion 14*a* of the thin conductive strip 14 and the opposed surface of notch 11*f* provided in the notched conductor block 11 (see FIG. 1*a*). This space or gap 19 is filled with the second insulation member 14. The edges 17*d*, 18*d* of these printed wiring boards are positioned adjacent the extremities of the tri-plate structure which when electrically connected thereto by soldering or a conductive epoxy, serves as a mechanical support for the boards 17 and 18. If desired, the interboard connector may be used with tri-plate printed wiring boards wherein each board 17 and 18 may have a second ground plane 17*d*, 18*d* insulated from the printed wire conductors 17*c* and 18*c* by a second insulating substrate 17*e*, 18*e* (shown in dotted fashion). Ground planes 17*d* and 18*d* may then be electrically connected to conductive surface 13*a*.

As can clearly be seen from the above description there is no need whatsoever for any conventional fastening means either for joining member 12 to member 11 or for electrically and mechanically joining the printed wiring boards 17 and 18 to the interboard connector assembly 10.

FIG. 1*c* shows one of the printed wiring boards 18 spaced from insertion slit 16 and positioned for insertion. It can be seen that the printed wiring board 18 is provided with an edge 18*d* which is inserted between strips 13 and 14.

The employment of a flat tape-like conductive strip 14 provides excellent electrical connection between the printed wire conductors 17*c*, 18*c*, provides excellent impedance matching between these printed wire conductors (due to its tri-plate construction) and further provides a low VSWR, which requirements are extremely critical in microwave and high-speed switching applications such as are encountered in the present day computer circuitry.

Whereas the embodiments of FIGS. 1*a*–3 show an arrangement for providing an electrical connection between one printed wire conductor of a first printed wiring board and one printed wire conductor of a second printed wiring board, it should be understood that the interboard connector may be designed to provide electrical connections between a substantially greater number than that shown. For example, FIG. 4 shows a somewhat modified embodiment from that described in connection with FIGS. 1*a*–3 in which the notched conductor block 11' is provided with a plurality of notches 11*k'*, 11*m'* and 11*n'* for receiving C-shaped conductive members 12, 12' and 12'', respectively, each of which is identical in design to the C-shaped conductor block of FIGS. 1*b*, 2*a* and 2*b*. The embodiment of FIG. 4 provides three pairs of insertion slits 15–16, 15'–16' and 15''–16'' with the upper insertion slits being adapted to allow the free ends of the tri-plate structures to extend therefrom to connect with upper and lower printed wiring boards. The electrical connections for each of these printed wiring boards are substantially identical to those shown in FIG. 3. Whereas the embodiment of FIG. 4 shows an arrangement for making interboard connections with three pairs of printed wire conductors, it should be understood that a vastly greater number of such connections may be provided by machining or otherwise forming the notched conductor block 11 accordingly.

FIG. 5 shows still another embodiment of the present invention in which notched conductor block 11'' is provided with a substantially wider notched portion 11*p* for receiving a wider C-shaped conductive member 12''' which is shown as a front elevational view in FIG. 5*a*. In this embodiment, member 12''' has press-fitted therein a wider insulating substrate 13' having a plurality of thin tape-like conductors 13*b* deposited, affixed or otherwise formed thereon so as to be arranged in spaced substantially parallel fashion as shown. In this embodiment the need for providing a plurality of notches in block 11 and a plurality of narrow C-shaped conductor blocks is avoided to simplify production of the components. It should further be noted that all of the advantages of simplicity and design and efficiency of operation of the embodiment of FIG. 1*c*, for example, are completely preserved in the alternative arrangements of FIGS. 4 and 5. Other obvious arrangements may consist of increasing or decreasing the height H (see FIG. 1*a*) of the notched conductor block 11 and increasing and/or decreasing the depth of the notches so as to provide for greater or lesser spacing between the insertion slits 15 and 16.

FIGS. 6 and 6a show another embodiment 25 of the present invention in which like elements as between FIGS. 1*a*–1*d* and FIGS. 6 and 6*a* are designated with like numerals. The embodiment 25 of FIGS. 6 and 6*a* is comprised of a block 11 and C-shaped conductive member 12 fitted together in the same manner as shown in all previous embodiments. The difference between the embodiment of FIG. 2*b* and FIGS. 6 and 6*a* lies in the fact that the connector strip which is preferably a 50 ohm tab, is the only component which extends beyond the surface S of block 11 (see FIG. 6) the ground planes (i.e., conductive surfaces 13*a* and 141) and the insulation strips 13 and 14 having been cut off so that their outmost edges E are flush with the surface S.

It can be seen from the foregoing description that the present invention provides a novel and yet highly reliable interboard connector assembly for connecting printed wiring boards and which is especially adapted for use in microwave and high-speed switching applications which require highly reliable electrical connections, good impedance matching through the connections and a low VSWR.

Although there has been described a preferred embodiment of this novel invention, many variations and modifications will now be apparent to those skilled in the art. Therefore, this invention is to be limited, not by the specific disclosure herein, but only by the appending claims. For example, the free ends of conductor strip 13*b* in FIG. 6*a* may be employed to connect two spaced leads $L_1$ and $L_2$ together, which leads may be the terminals of discrete components or other devices which are not necessarily mounted or otherwise formed on printed wiring boards.

What is claimed is:

1. A connector for establishing an electric connection between circuits provided on first and second printed wiring boards, said connector comprising:

a conductive block having first and second grooves formed in first and second parallel surfaces of said block and a third groove being formed in a surface adjacent said first and second surfaces whereby said third groove joins said first and second grooves;

a U-shaped conductive member being force-fittingly positioned within the grooves of said block with the yoke of said conductive member seated in said third groove and the arms of said conductive member seated in said first and second grooves;

said grooves each having planar base portions;

the confronting surfaces of said base portions and said conductive member being spaced from one another to form a hollow U-shaped interior space;

a thin flat coupling conductor being positioned in said hollow interior space and being bent to conform with said interior space;

said coupling conductor lying a spaced distance from said block and said conductive member so as to be electrically insulated therefrom;

the spacing between said block and said conductive member forming a pair of narrow slits in a fourth surface of said block parallel to said third surface whereby the free ends of said joining conductor extend outwardly therefrom for coupling with the edges of printed wiring boards each having at least one printed wire conductor deposited upon an insulating substrate;

said coupling conductor engaging the printed wire conductors of the printed wiring boards to provide a conductive path therebetween.

2. The connector of claim 1 further comprising a pair of flat thin insulating flexible substrates positioned on opposite sides of said joining conductor; said joining conductor being secured to one surface of one of said flexible substrates;

said flexible substrates being bent to conform to the contour of said hollow interior space and having its opposite surface engaging said conductive member; the projecting ends of said flexible substrates and said joining conductor extending outwardly from said connector; said printed wiring boards being inserted between said flexible substrates to engage said joining conductor.

3. A connector for establishing an electric connection between circuits provided on first and second printed wiring boards said connector comprising:

a conductive block having first and second grooves formed in first and second parallel surfaces of said block and a third groove being formed in a surface adjacent said first and second surfaces whereby said third groove joins said first and second grooves;

a U-shaped conductive member being force-fittingly positioned within the grooves of said block with the yoke of said conductive member seated in said third groove and the arms of said conductive member seated in said first and second grooves;

said grooves each having planar base portions;

the confronting surfaces of said base portions and said conductive member being spaced from one another to form a hollow U-shaped interior space;

a plurality of thin flat coupling conductors being positioned at spaced intervals in said hollow interior space and each being bent to conform with said interior space;

said coupling conductors lying a spaced distance from said block and said conductive member so as to be electrically insulated therefrom;

the spacing between said block and said conductive member forming a pair of narrow slits in a fourth surface of said block parallel to said third surface to enable the ends of said conductor to extend outwardly therefrom for electrical connection with the edges of printed wiring boards each having a plurality of printed wire conductors deposited upon an insulating substrate;

each of said coupling conductors engaging associated printed wire conductors of the inserted printing wiring boards to be interconnected in an electrical circuit to provide conductive paths therebetween.

4. The connector of claim 3 further comprising first and second flat thin flexible insulating substrates positioned on opposite sides of said coupling conductors; said coupling conductors being secured to one surface of one of said flexible substrates;

said flexible substrates being bent to conform to the contour of said hollow interior space and having conductive coatings on their opposite surfaces respectively engaging said block and said conductive member; the projecting ends of the coupling conductors electrically connecting the edges of said printing wiring boards to provide electrical connections therebetween.

5. A connector for establishing an electric connection between circuits provided on first and second printed wiring boards said connector comprising:

a conductive block having a plurality of U-shaped notches arranged at spaced intervals along said block, each of said notches being defined by a plurality of first and second grooves formed in first and second parallel surfaces of said block and a plurality of third grooves being formed in a surface adjacent said first and second surfaces whereby each of said third grooves is joined with a first and second groove;

a plurality of U-shaped conductive members being force-fittingly positioned within an associated one of said U-shaped notches of said block with the yoke of each conductive member seated in one of said third grooves and the arms of said conductive member seated in associated ones of said first and second grooves;

said grooves each having planar base portions;

the confronting surfaces of said base portions and said conductive member being spaced from one another to form a plurality of hollow U-shaped interior spaces;

a thin flat coupling conductor being positioned in each of said hollow interior spaces and being bent to conform with its associated interior space;

said coupling conductor lying a spaced distance from said block and said conductive member so as to be electrically insulated therefrom;

the spacing between said block and each of said conductive members forming a pair of narrow slits in a fourth surface of said block parallel to said third surface for enabling the ends of said coupling conductors to extend outwardly therefrom and to engage the edges of printed wiring boards each having a plurality of printed wire conductors deposited upon an insulating substrate;

said coupling conductors engaging the printed wire conductors of the inserted printing wiring boards to provide a conductive path therebetween.

6. The connector of claim 1 further comprising a plurality of pairs of flat thin flexible insulating substrates positioned on opposite sides of their associated conductor, said conductors each being secured to one surface of an associated one of said pair of flexible substrates;

said flexible substrates being bent to conform to the contour of its hollow interior space and having conductive coatings on their opposite surfaces respectively engaging their associated notches and conductive members, the edges of said printed wiring boards being inserted between the flexible substrates to engage said coupling conductor.

7. A connector for establishing an electric connection between first and second spaced conductive leads, said connector comprising:

a conductive block having first and second grooves formed in first and second parallel surfaces of said block and a third groove being formed in a surface adjacent said first and second surfaces whereby said third groove joins said first and second grooves;

a U-shaped conductive member being force-fittingly positioned within the grooves of said block with the yoke of said conductive member seated in said third groove and the arms of said conductive member seated in said first and second grooves;

said grooves each having planar base portions;

the confronting surfaces of said base portions and said conductive member being spaced from one another to form a hollow U-shaped interior space;

a thin flat coupling conductor being positioned in said hollow interior space and being bent to conform with said interior space;

said coupling conductor lying a spaced distance from said block and said conductive member so as to be electrically insulated therefrom;

the spacing between said block and said conductive member forming a pair of narrow slits in a fourth surface of said block parallel to said third surface whereby the free ends of said joining conductor extend outwardly therefrom for coupling with the adjacent ends of the spaced conductive leads;

said coupling conductor engaging spaced conductive leads to provide a conductive path therebetween.

8. The connector of claim 1 further comprising a pair of flat thin insulating flexible substrates positioned on opposite sides of said joining conductor; said joining conductor being secured to one surface of one of said flexible substrates;

said flexible substrates being bent to conform to the contour of said hollow interior space and having its opposite surface engaging said conductive member; the projecting ends of said flexible substrates and said joining conductor extending from said connector; said printed wiring boards being inserted between said flexible substrates to engage said joining conductor.

* * * * *